US012783780B2

(12) United States Patent
Agarwal et al.

(10) Patent No.: US 12,783,780 B2
(45) Date of Patent: Nov. 3, 2026

(54) BUFFER COMPATIBLE WITH SKEW CRITICAL PROTOCOLS IMPLEMENTED IN AN INTEGRATED CIRCUIT AND METHODS FOR ROUTING METAL LINES TO THE BUFFER IN THE INTEGRATED CIRCUIT

(71) Applicant: NXP USA, Inc., Austin, TX (US)

(72) Inventors: Gaurav Agarwal, Noida (IN); Himanshu Mangal, Agra (IN); Siddhartha Jain, Noida (IN); Sachin Kalra, Indirapuram (IN); Amol Agarwal, Noida (IN)

(73) Assignee: NXP USA, Inc., Austin, TX (US)

(*) Notice: Subject to any disclaimer, the term of this patent is extended or adjusted under 35 U.S.C. 154(b) by 728 days.

(21) Appl. No.: 18/335,184

(22) Filed: Jun. 15, 2023

(65) Prior Publication Data

US 2024/0354483 A1 Oct. 24, 2024

(30) Foreign Application Priority Data

Apr. 18, 2023 (IN) ............................ 202341028335

(51) Int. Cl.
*G06F 30/30* (2020.01)
*G06F 30/31* (2020.01)
*G06F 30/394* (2020.01)

(52) U.S. Cl.
CPC ............ *G06F 30/394* (2020.01); *G06F 30/31* (2020.01)

(58) Field of Classification Search
None
See application file for complete search history.

(56) References Cited

U.S. PATENT DOCUMENTS

| | | | | |
|---|---|---|---|---|
| 7,487,488 | B1 * | 2/2009 | Huang | G06F 30/394 716/130 |
| 7,996,804 | B2 | 8/2011 | Nikitin et al. | |
| 8,432,210 | B2 * | 4/2013 | Brown | G06F 1/10 327/285 |
| 8,966,425 | B1 | 2/2015 | Eisenstadt et al. | |
| 11,144,703 | B1 * | 10/2021 | Wang | G06F 30/30 |
| 11,423,204 | B1 * | 8/2022 | Chen | G06F 30/392 |
| 2012/0105123 | A1 | 5/2012 | Brown et al. | |
| 2021/0384186 | A1 * | 12/2021 | Kim | H10D 89/10 |
| 2022/0335194 | A1 | 10/2022 | Chen et al. | |
| 2023/0385504 | A1 * | 11/2023 | Li | H10D 84/907 |

* cited by examiner

*Primary Examiner* — Leigh M Garbowski

(57) ABSTRACT

A buffer in an integrated circuit comprises one or more logic circuits, an input signal pin electrically coupled to an input of one of the one or more logic circuits, and an output signal pin electrically coupled to an output of one of the one or more logic circuits. The input signal pin and output signal pin are positioned on a same routing track of the integrated circuit which specifies a routing in the integrated circuit. A respective segment of a net routed to the input and output signal pin is on the same routing track.

20 Claims, 6 Drawing Sheets

BUFFER COMPATIBLE WITH SKEW CRITICAL PROTOCOLS IMPLEMENTED IN AN INTEGRATED CIRCUIT AND METHODS FOR ROUTING METAL LINES TO THE BUFFER IN THE INTEGRATED CIRCUIT

CROSS-REFERENCE TO RELATED APPLICATIONS

This application claims the priority under 35 U.S.C. § 119 of India Patent application no. 202341028335, filed on 18 Apr. 2023, the contents of which are incorporated by reference herein.

FIELD OF USE

This disclosure generally relates to a buffer in an integrated circuit, and more particularly to a buffer compatible with skew critical protocols implemented in an integrated circuit and methods for routing metal lines to the buffer in the integrated circuit.

BACKGROUND

Skew critical protocols like a source-synchronous interface (SSI) require tight control on skew between clock signals, between data signals, or between clock and data signals in an integrated circuit across process, voltage, and temperature conditions to meet performance targets. The skew is typically affected by differences in clock net lengths and/or data net lengths in the integrated circuit which carry the clock and data signals, respectively. A length of a metal line, a number of layers used for routing metal lines in the integrated circuit, and a number of vias through which the metal lines are routed between layers of the integrated circuit are examples of factors which impact the net length and as a result the skew.

Figure 1:
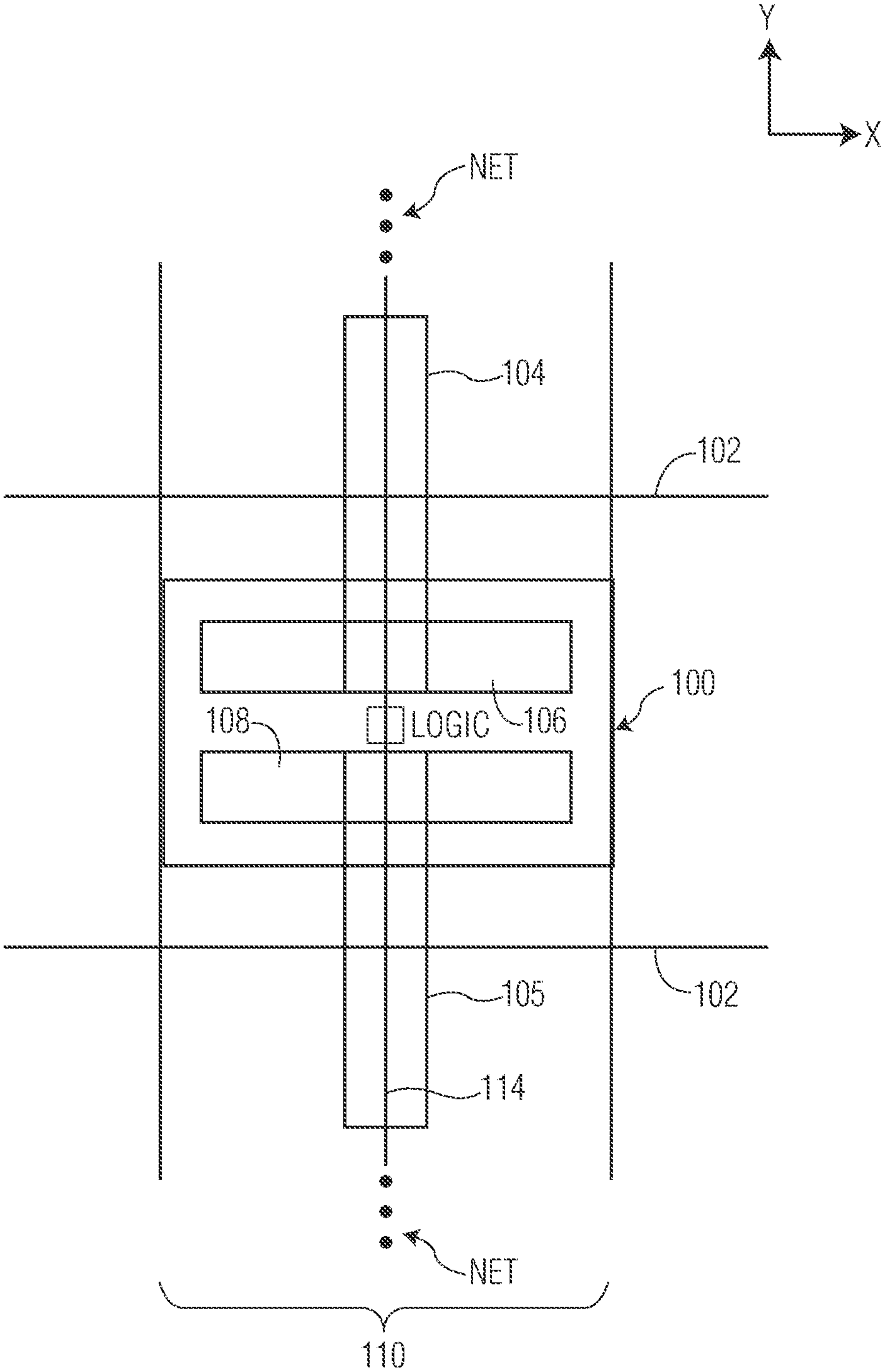
FIG. 1 illustrates a top view of an example buffer formed on a layer of an integrated circuit in accordance with an embodiment.

The drawings are for the purpose of illustrating example embodiments, but it is understood that the embodiments are not limited to the arrangements and instrumentality shown in the drawings.

DETAILED DESCRIPTION

The detailed description of the appended drawings is intended as a description of the various embodiments of the present disclosure, and is not intended to represent the only form in which the present disclosure may be practiced. It is to be understood that the same or equivalent functions may be accomplished by different embodiments that are intended to be encompassed within the spirit and scope of the present disclosure.

Electronic design automation (EDA) tools are used to implement nets in an integrated circuit. The net may define a set of connections between cells in the integrated circuit which are circuits that form building blocks of the integrated circuit. To define the net, the EDA tools perform a track-based routing which is a process of determining routing of metal lines in the integrated circuit.

The metal line is a conductive path which forms an interconnect in the integrated circuit. The routing of the metal line is limited to predefined tracks which indicate a direction that the metal line is to be placed in the track-based routing. Each layer has the predefined tracks and tracks in different directions on a layer and/or spatial locations on a layer are defined as different tracks. The integrated circuit further includes a plurality of layers and routing of metal lines is determined on each layer with vias formed between layers to route the metal lines between layers. The integrated circuit is then fabricated by forming metal lines on the specified track and layer of the integrated circuit indicated by the track-based routing in accordance with a semiconductor metal deposition process, examples of which are chemical and vapor deposition.

The integrated circuit typically includes a cell in the form of a buffer to distribute or repeat a clock or data signal. The buffer may be a clock buffer for distributing or repeating a clock signal or a data buffer for distributing or repeating a data signal. The buffer has an input signal pin for receiving a clock or data signal and an output signal pin for outputting the clock or data signal. The input signal pin and output signal pin are coupled to the net of the integrated circuit.

The input signal pin and the output signal pin of the buffer are typically positioned on different tracks of the integrated circuit to maximize tap points for connectivity during the routing of the net, but a trade-off is that the routing of the net typically requires a detour. For example, the routing process may involve routing a metal line on one track with the input signal pin and routing a metal line to another track with the output signal pin resulting in a detour from one track to another track between the input and output pins. The detour increases a skew between signals carried in the integrated circuit when the integrated circuit is fabricated based on route determined by the router. Signals that pass through the buffer need to travel through an additional distance compared to other signals in the integrated circuit which do not pass through the buffer, increasing the skew between groups of signals.

Example Systems

FIG. 1 illustrates a top view of an example buffer 100 formed on a layer of an integrated circuit in accordance with an embodiment. The buffer 100 unlike conventional buffers in an integrated circuit has a reduced impact on skew between a signal which passes through the buffer 100 and other signals of a group of signals. The skew is defined as a difference in arrival among signals in a group of signals. The example buffer 100 may be arranged to receive a signal associated with the skew critical protocols and output a signal associated with the skew critical protocols while maintaining a tight skew between the signal that pass through the buffer 100 and signals that do not pass through the buffer. Skew critical protocols requires tight control on skew between clock signals, between data signals, and/or between clock and data signals across process, voltage, and temperature conditions to meet performance targets. In an example, the integrated circuit may implement a skew critical source-synchronous interface (SSI) protocol which requires skew control.

The top view of the clock buffer 100 illustrates, in a layer of the integrated circuit, tracks 102 in a parallel direction shown in an X direction also referred to as a horizontal direction of an X-Y plane and tracks 110 in a parallel direction shown in a Y direction of the X-Y plane also referred as a vertical direction. In an example, each layer of the integrated circuit may have tracks 102 and tracks 110 and a track with a same spatial position in one layer and another layer is referred to as a same track herein. In the buffer 100, a routing to an input signal pin 106 and an output signal pin 108 may be on a same track 114 which is in the Y direction. The input signal pin 106 may receive a signal input into the buffer 100 which is then provided to a logic circuit in the buffer 100 such as an inverter, OR gate, or AND gate and the output signal pin 108 may output a signal from the buffer 100 based on output from the logic circuit. The buffer 100, also known as a repeater, provides electrical impedance transformation from one circuit to another with the aim of preventing a signal source from being affected by whatever currents (or voltages, for a current buffer) that a load may be produced with. To route the signal pins of the buffer 100 to the net, a segment of a net may be routed to the input signal pin 106 and a segment of the net may be routed to the output signal pin 108. A segment is a metal line associated with a portion of a net in the integrated circuit and segment 104 of the net may be routed to the input signal pin 106 and a segment 105 of the net may be routed to the output signal pin 108, where in an example the segments are in the same layer. Further, the pins which are a metal line oriented perpendicular to respective segment may be further electrically coupled to the respective segment. Buffer 100 illustrates the result of this routing, where the metal lines and pins may be formed on one or more layers of the integrated circuit as part of metal deposition process associated with semiconductor fabrication.

In an example, the input signal pin 106 and the output signal pin 108 may be on track 114 and formed through one or more layers. For example, the buffer 100 may be in a base layer MO and the pins formed by a metal routed through a via of a plurality of layers in the integrated circuit to an upper layer above the base layer. The segment may be located on an upper layer and electrically coupled to the pins. The signal pin 106, 108 may provide a connection from the buffer 100 to the upper layers of the integrated circuit such as Metal 6 layer so that the net of the integrated circuit is routed through fewer layers and with less vias compared to if the signal pins were located in lower layers of the integrated circuit. The upper layers may be distinguished from the lower layers as being further in a vertical distance from a semiconductor substrate of the integrated circuit.

In an example, the buffer 100 reduces a need for a detour in routing metal lines from the input and output signal pins of the buffer 100 to the net. The detour typically involves routing a metal line from a track in one layer to another track in another layer and through a via. The additional length of the metal line needed to route the input and output signal pins to the net increases skew of signals in the integrated circuit. In an example, the segment may be a portion of a lane of a bus which couples to an SSI interface in the integrated circuit in an example. Other lanes of the bus may also carry signals which do not need to pass through the buffer 100. The signal on the lane which passes through the buffer may be delayed compared to signals on other lanes because of the additional length that the signal needs to travel which would otherwise increase skew between signals. For example, a group of lanes of an SSI with one lane having a buffer which is routed in the net using a detour may have a skew of X such as 117 picoseconds (ps) while a group of lanes which route signals using the buffer 100 reduces skew to Y such as 52 ps, and a net reduction of skew of X-Y or 64 ps. Such skew may take also the form of differences, along different connection paths, in signal timing delays, ramp-up or ramp-down times for a signal duty cycle, and aspects affecting signals such as voltage, capacitance, and temperature. By reducing the need to perform a detour, the skew between a signal passing through the buffer 100 and signals not passing through the buffer 100 does not otherwise increase as much. Further, fewer detours reduce a number of additional vias needed to implement the buffer 100 in the integrated circuit. The placement of the input signal pin 106 and output signal pin 108 on a same track 114 results in a single tap point on a same track to route the net to the signal pins of the buffer 100 and avoids the need to perform a detour to route metal lines to the signal pins of the buffer 100.

An arrangement of the buffer 100 may depend on a direction of the segments of the net which carries signals to the buffer. In buffer 100, the signal pins 106, 108 of the buffer 100 may be along the track 110 which allows for electrically coupling to a segment on the track 110. This arrangement may result in the buffer 100 spanning multiple tracks in the X direction and the signal pins 106, 108 coupled to the segments 104, 105 formed over the track 114.

Figure 2:
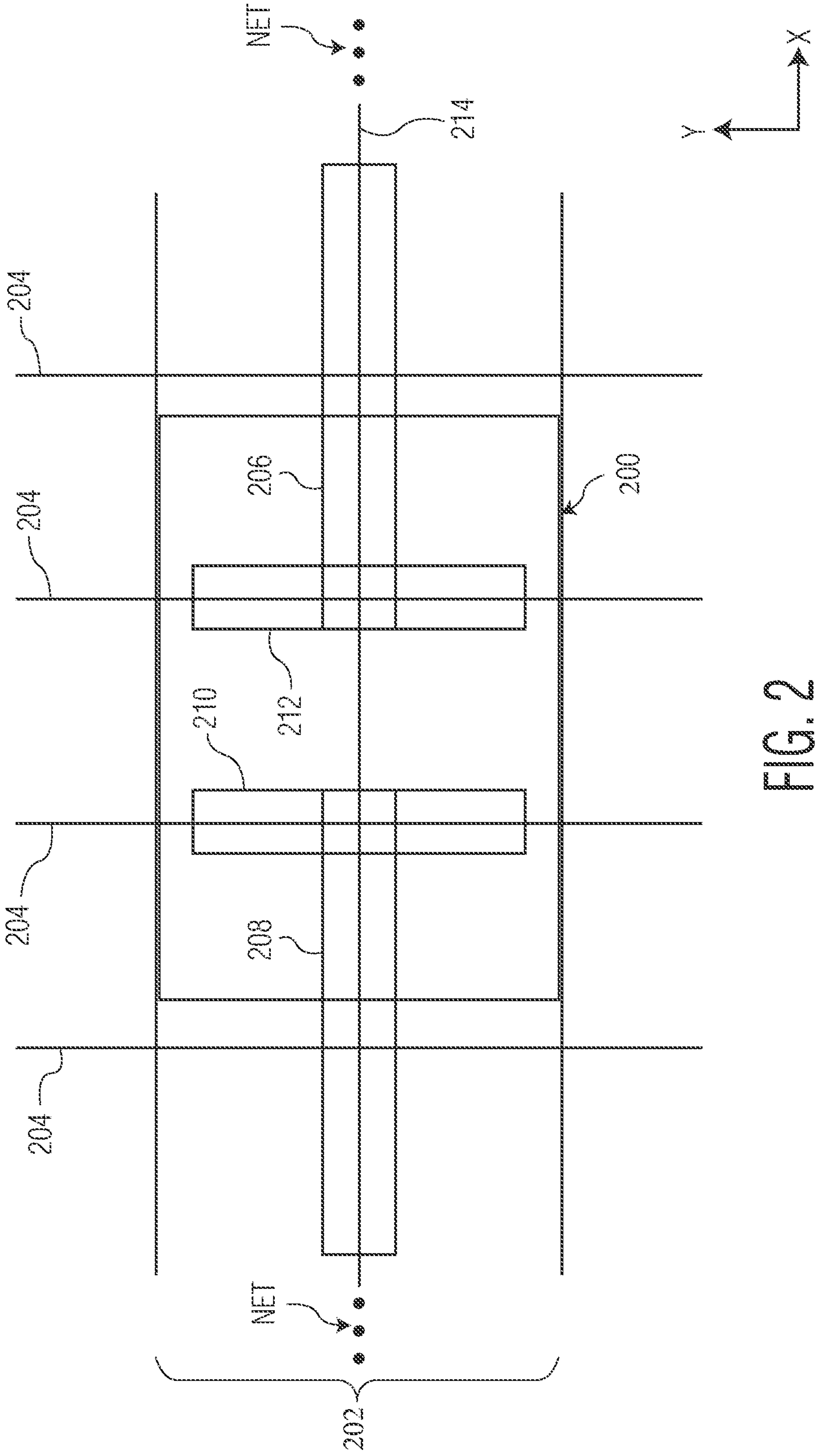
FIG. 2 illustrates a top view of another example buffer in accordance with an embodiment.

FIG. 2 illustrates a top view of another example buffer 200 formed on a layer of an integrated circuit in accordance with an embodiment. The top view of the buffer 200 illustrates, in the layer of the integrated circuit, tracks 204 in a parallel direction shown in the Y direction and tracks 202 in a parallel direction shown in the X direction. In the buffer 200, a input signal pin 210 and an output signal pin 212 may be on a same track 214 which is in the X direction. The input signal pin 210 and output signal pin 212 may be electrically coupled to the logic circuit (not shown) in the buffer 200. To route the buffer 200 to the net, a segment of a net may be routed to the input signal pin 210 and a segment of the net may be routed to the output signal pin 212 and the pins may be perpendicular to the respective segment. In an example, a segment 208 of the net is routed along the X direction to the input signal pin 210 and a segment 206 of the net is routed along the X direction to the output signal pin 212. Buffer 200 is arranged a result of this routing, where metal lines may be formed on a layer of the integrated circuit as part of metal deposition process associated with semiconductor fabrication. In an example, a detour may not be needed to route metal lines from the input signal pin 210 or output signal pins 212 to the net. The skew between signals passing through the buffer 200 and not passing through the buffer 200 may also not increase as much. This arrangement may result in the buffer 200 spanning multiple tracks in the Y direction and the signal pins 210, 212 coupled to the segments 206, 208 formed over the track 214. Further, the non-detour reduces a number of additional vias needed to implement the buffer 200 in the integrated circuit.

In an example, the input signal pin 210 and the output signal pin 212 may be on track 214 and formed through one or more layers. For example, the buffer 100 may be in a base layer MO and the pins formed by a metal routed through a via of a plurality of layers in the integrated circuit to an upper layer above the base layer. The segment 206, 208 may be located on an upper layer and electrically coupled to the pins. The signal pin 210, 212 may provide a connection from the buffer 200 to the upper layers of the integrated circuit such as Metal 6 layer.

In an example, the integrated circuit may comprise a plurality of buffers, each arranged dependent on a direction of a segment of the net carrying the signals and coupled to the input signal pin of the buffer or output signal pin of the buffer.

Figure 3:
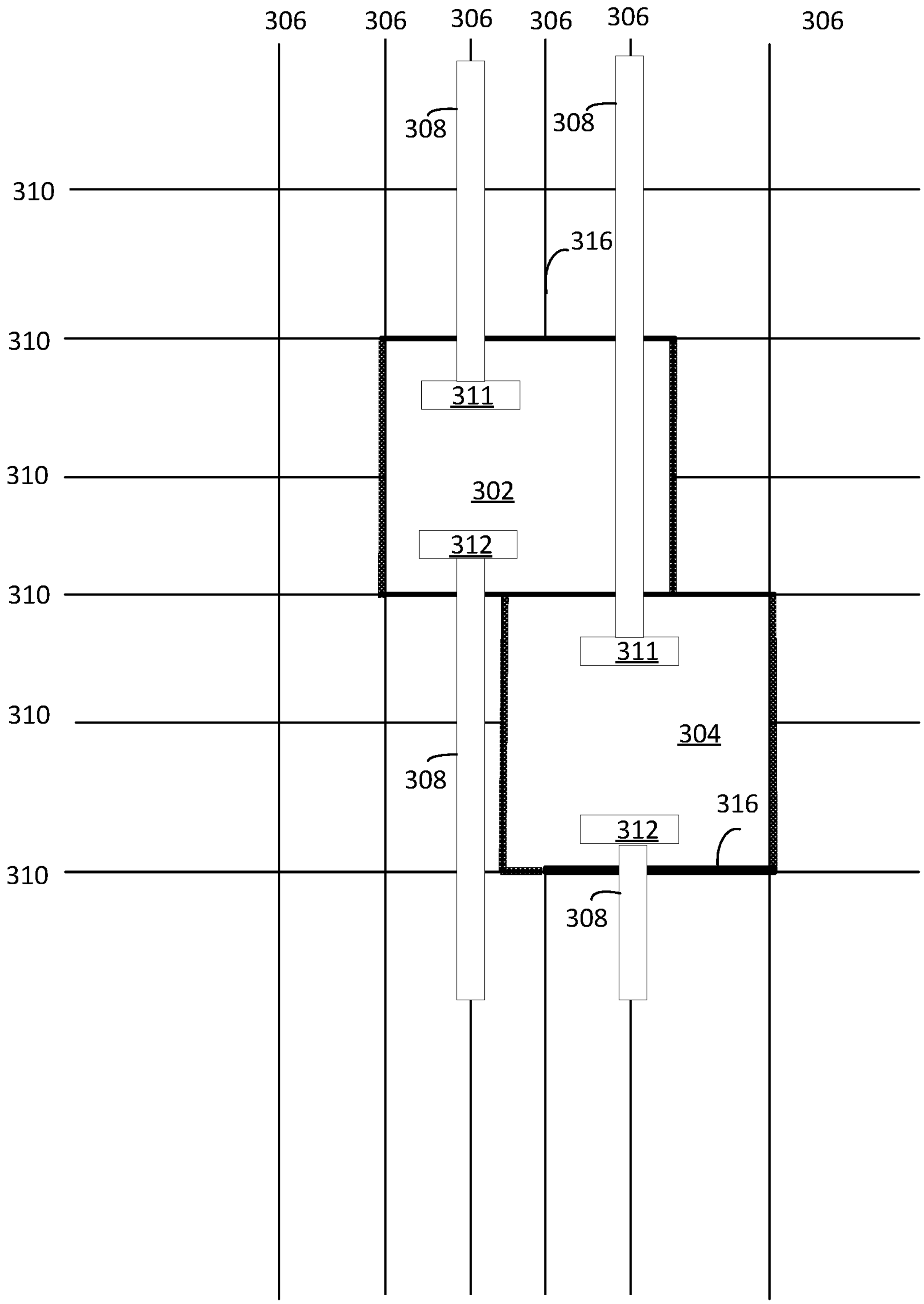
FIG. 3 illustrates a top view of multiple clock buffers formed on a layer of an integrated circuit in accordance with an embodiment.

FIG. 3 illustrates a top view of multiple buffers formed on a layer of an integrated circuit in accordance with an embodiment. Two buffers 302, 304 are illustrated on the layer but a layer of the integrated circuit may include more than or less than two buffers. In an example, the net may have a plurality of segments which are routed over a track 306 to the example buffer 302, 304. In the top view, a segment 308 of the net carrying signals in the integrated circuit is routed in a vertical direction. Each buffer 302, 304 may span one or more tracks 310 in the horizontal direction and a segment 308 routed to an input signal pin 311 or output signal pin 312 of the buffer 302, 304 may be positioned in the vertical direction along track 306. In the example, the buffer 302, 304 may be a double height cell which spans at least two tracks 310 in the vertical direction and may satisfy design rule constraints associated with EDA or foundry requirements. Further, at least one track 306 in the vertical direction may be in between segments 308 of one buffer and segments 308 in another buffer and referred to as a shield line 316 to provide shielding between the pins 310, 312 and segments 308 associated with different buffers which are carrying signals. In an example, the buffer 302 and buffer 304 may be offset from each other along a common side in a step pattern in the vertical direction so that at least one track 306 is in between the segments 308 of the buffers and usage of tracks 306 is optimized to minimize an occupied area of the buffers 302, 304. A number of the at least one track 306 which is in between the segments 308 of the buffers may be based on a width of the buffer in the horizontal direction in an example.

Rows are multiples of a site definition in a horizontal direction where a site may be a unit of placement where the cell can be placed on a layer of the integrated circuit. In an example, buffer 302 may be located in a different site row than the buffer 304. In an example, the segment 308 associated with buffer 302 may be routed in a different layer than the segment 308 associated with buffer 304.

Figure 4:
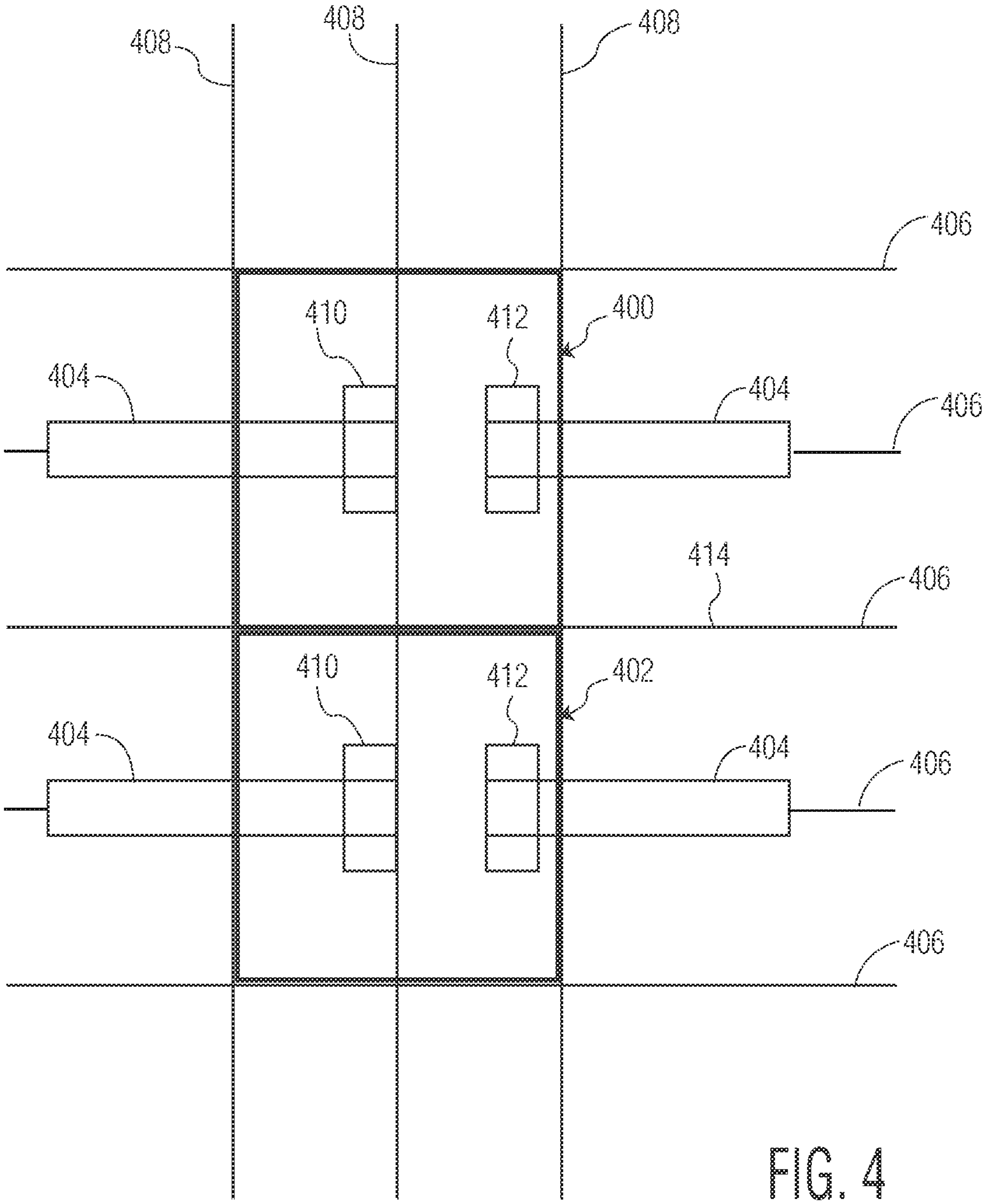
FIG. 4 illustrates another top view of multiple clock buffers formed on a layer of an integrated circuit in accordance with an embodiment.

FIG. 4 illustrates another top view of multiple buffers 400, 402 formed on a layer of an integrated circuit in accordance with an embodiment. Two buffers 400, 402 are illustrated on the layer but a layer of the integrated circuit may include more than two buffers. The net may have a plurality of segments which are routed over a track 406 to the example buffers 400, 402. In the top view, segments 404 carrying signals in integrated circuit are routed on track 406 oriented in a horizontal direction. Each buffer 400, 402 may span one or more tracks 408 oriented in the vertical direction and a segment 404 is routed to an input signal pin 410 or output signal pin 412 of each buffer 400, 402. The signal pin 410, 412 may be oriented perpendicular to segment 404. Further, at least one track 406 in the horizontal direction labelled as track 414 may be between adjacent buffers 400, 402 and a metal line may be routed on the track 414 to provide shielding between the segments 404 associated with different buffers.

In an example, the buffer 400 may be located in a different site row than the buffer 402. In an example, the segment 404 associated with buffer 400 may be routed in a different layer than the segment 404 associated with buffer 402.

Figure 5:
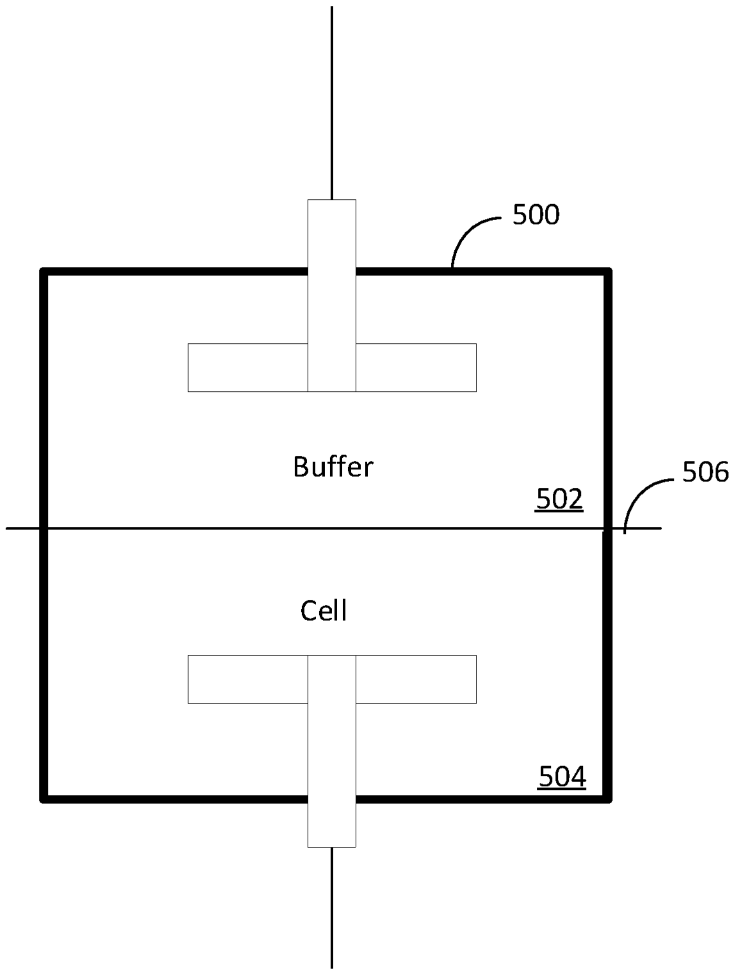
FIG. 5 illustrates an example multifunction cell which is arranged with circuitry to perform functions in addition to buffering.

FIG. 5 illustrates an example multifunction cell 500 which is arranged with circuitry to perform functions in addition to buffering. The multifunction cell 500 has circuitry 502 associated with buffering and additional area for circuitry 504 available for circuitry to perform an additional function to the buffering. In an example, the circuitry 504 may implement a standard cell of an EDA tool. A shield line is a track 506 which passes through the buffer 500 to isolate the circuitry 502 and circuitry 504. In an example, the shield line may provide shielding of signal interference between the circuitry 502, 504. In an example, the buffer 500 may have double height or double width similar to the buffers described above.

Figure 6:
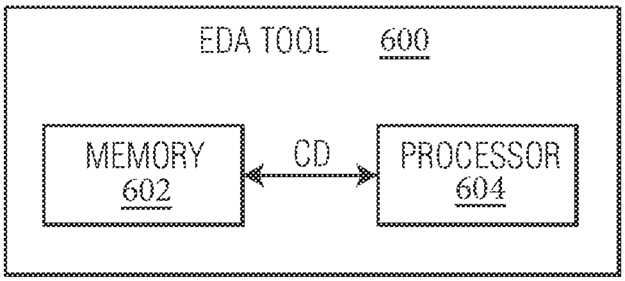
FIG. 6 illustrates a block diagram of an electronic design automation (EDA) tool in accordance with an embodiment.

FIG. 6 illustrates a schematic block diagram of an EDA tool 600 in accordance with an embodiment of the present disclosure. The EDA tool 600 can be configured to enable the routing associated with the disclosed buffer formed on the integrated circuit. The EDA tool 600 can include a memory 602 and a processor 604 that can be coupled with the memory 602. The processor 604 and the memory 602 form a computer system that may represent a stand-alone personal computer, a network of processors and memories, a mainframe system, or the like. The processor 604 can include suitable circuitry that can be configured to perform one or more operations. For example, the processor 604 can be configured to retrieve the control data (CD) from the memory 602. The processor 604 can be further configured to perform a routing process to route segments of the net to the signal pins of a plurality of buffers on the layer of the integrated circuit as disclosed herein. The disclosed routing is based on defining a routing grid such as Manhattan routing to route the metal lines in the integrated circuit. The result of the routing process may be then used to form metal lines on the layer of the integrated circuit as part of metal deposition process associated with semiconductor fabrication. Examples of the processor 604 can include, but are not limited to, an application-specific integrated circuit processor, a reduced instruction set computing processor, a complex instruction set computing processor, a field-programmable gate array, or the like.

Example Methods

Figure 7:
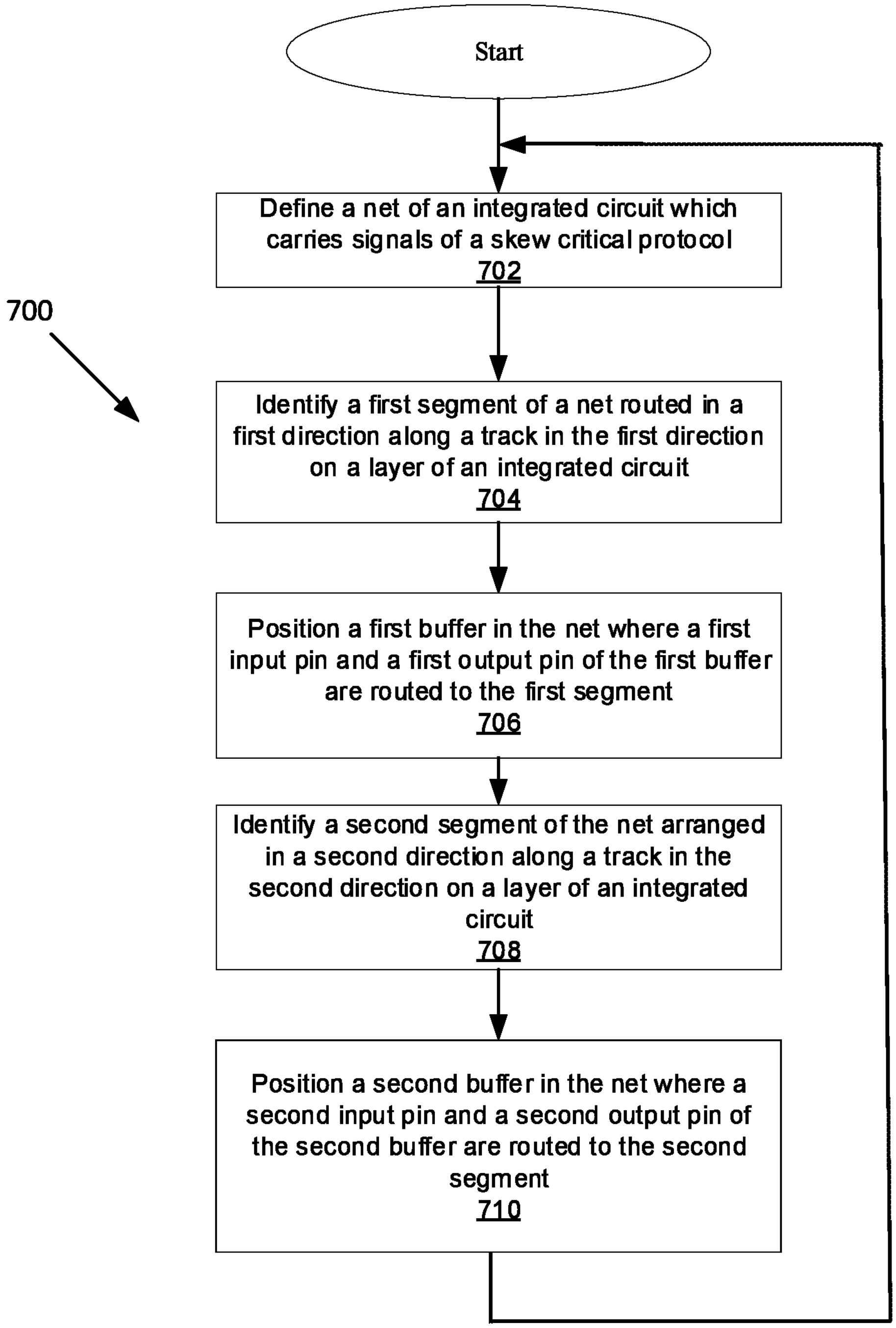
FIG. 7 is a flow chart of example functions associated with routing to the buffer in the accordance with an embodiment.

FIG. 7 is a flow chart of example functions 700 associated with routing to the buffer in the accordance with an embodiment. The functions may be performed by a routing tool such the EDA tool 600 in an example to implement the buffer in the integrated circuit.

At 702, a net of an integrated circuit which carries signals of a skew critical protocol is defined. The EDA tool may define the net and be based on a layout of buffers in the net. The net may be routed in accordance with a Manhattan routing and generate segments of the net arranged along tracks in a X or Y direction which are perpendicular directions to each other.

At 704, a first segment of a net routed in a first direction along a track in the first direction on a layer of an integrated circuit is identified. The first direction may be one of a horizontal or vertical direction in an example. At 706, a first buffer is positioned in the net where a first input pin and a first output pin of the first buffer are routed to the first segment. In this routing, a portion of the first segment between the first input pin and the first output pin may be removed from the net so that the first input pin and the first output pin are not electrically coupled by the portion of the first segment in an example. At 708, a second segment of the net arranged in a second direction along a track in the second direction on a layer of an integrated circuit is identified. The second direction may be perpendicular to the first direction. At 710, a second buffer is positioned in the net where a second input pin and a second output pin of the second buffer are routed to the second segment. In this routing, a portion of the second segment between the second input pin and the second output pin may be removed from the net so that the second input pin and the second output pin are not electrically coupled by the portion of the second segment in an example. In an example, processing may then return back to step 702 to position additional buffers in the integrated circuit.

By arranging input and output signal pins of the buffer on a same track, segments of the net which are routed to the signal pins do not need to include a detour between tracks reducing a skew between a signal which passes through the buffer and signals which do not pass through the buffer. Further, in an example, the first segment routed to the first input pin to the buffer may have identical routing topologies with the first segment routed to the first output pin from the buffer. For example, the first segment may be routed to the first input pin which passes through layer(s) to the buffer which is the same layer(s) as the first segment routed to the first output pin which passes through the layer(s) from the buffer. Still further, in an example, the first segment routed to the first input pin and the second segment routed to the second input pin may have identical routing topologies and the first segment routed to the first output pin and the second segment routed to the second output pin may have identical routing topologies. For example, the first segment may be routed to the first input pin which passes through first layer(s) to the buffer and the second segment may be routed to the second input pin which passes through the same first layer(s) to the buffer. As another example, the first segment may be routed to the first output pin which passes through second layer(s) to the buffer and the second segment may be routed to the second output pin which passes through the same second layer(s) to the buffer. The first and second layer(s) may be the same or different.

In one embodiment, a buffer arranged in an integrated circuit is disclosed. The buffer comprises one or more logic circuits; and an input signal pin electrically coupled to an input of one of the one or more logic circuits and an output signal pin electrically coupled to an output of one of the one or more logic circuits; wherein the input signal pin and output signal pin are positioned on a same routing track which specifies a routing in the integrated circuit and a respective segment of a net routed to the input and output signal pin is on the same routing track. In an example, the routing track is oriented in a horizontal or vertical direction in the integrated circuit. In an example, the buffer is formed in a first layer of the integrated circuit and signal pins are arranged through one or more layers of the integrated circuit from the first layer to an second layer on which the segments is routed. In an example, a skew of a group of signals which includes a signal output by the output signal pin or input by the input signal pin is less than a threshold amount. In an example, one or more routing tracks in parallel with the routing track are in between the segments of the buffer and segments of another buffer where the segments of the other buffer are routed parallel to the routing track, the buffer and the other buffer arranged offset from each other along a common side. In an example, the segments routed to the input signal pin and the output signal pin have identical routing topologies. In an example, the segments comprises a lane of a bus of a source synchronous interface. In an example, the buffer spans a distance of two or more routing tracks perpendicular to the same routing track. In an example, a logic circuit of the one or more logic circuits is selected from a group comprising an AND gate, OR gate, and inverter. In an example, a track is in between the segments, the segments being electrically coupled to the buffer and different segments electrically coupled to another buffer, the different segments along another track parallel to the routing track. In an example, the net of the integrated circuit is defined by a Manhattan routing and the same routing track is in an X or Y direction, where the X and Y direction are perpendicular to each other. In an example, a signal is received by the input signal pin from a first segment of the segments formed on the routing track and is output by the output signal pin to a second segment of the segments formed on the routing track.

In another embodiment, a method for an electronic design automation (EDA) tool to perform routing in an integrated circuit is disclosed. The method comprises defining a net in the integrated circuit associated with a skew critical protocol; identifying a first segment of a net routed in a first direction along a first track in the first direction on a layer of an integrated circuit; positioning a first buffer in the net where the first segment is routed to a first input pin and a first output pin of the first buffer, the first input pin and first output pin positioned on the first track; identifying a second segment of the net arranged in a second direction along a second track in the second direction on a layer of an integrated circuit; and positioning a second buffer in the net where the second segment is routed a second input pin and a second output pin of the second buffer, the second input pin and second output pin positioned on the second track; wherein the first segment is routed perpendicular to the second segment and the first track is perpendicular to the second track. In an example, each segment defines a respective lane of a bus coupled to a source synchronous interface. In an example, a routing of the first segment to the first pins and second pins does not include a detour to a different track. In an example, a track is in between the segments, the segments being electrically coupled to the buffer and segments electrically coupled to another buffer along another track parallel to the routing track. In an example, positioning the first buffer comprises positioning the first buffer so that one or more routing tracks in parallel with the first track are in between the first segment and segments of another buffer where the segments of the other buffer are routed in the first direction, the first buffer and the other buffer arranged offset from each other along a common side. In an example, the first segment routed to the first input pin has identical routing topologies to the second segment routed to the second input pin and the first segment routed to the first output pin has identical routing topologies to the second segment routed to the second output pin. In an example, the net of the integrated circuit is defined by a Manhattan routing and the same routing track is in an X or Y direction, where the X and Y direction are perpendicular to each other. In an example, the first buffer spans a distance of two or more tracks in the second direction.

A few implementations have been described in detail above, and various modifications are possible. The disclosed subject matter, including the functional operations described in this specification, can be implemented in electronic circuit, computer hardware, firmware, software, or in combinations of them, such as the structural means disclosed in this specification and structural equivalents thereof: including potentially a program operable to cause one or more data processing apparatus such as a processor to perform the operations described (such as a program encoded in a non-transitory computer-readable medium, which can be a memory device, a storage device, a machine-readable storage substrate, or other physical, machine readable medium, or a combination of one or more of them).

While this specification contains many specifics, these should not be construed as limitations on the scope of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations.

Use of the phrase "at least one of" preceding a list with the conjunction "and" should not be treated as an exclusive list and should not be construed as a list of categories with one item from each category, unless specifically stated otherwise. A clause that recites "at least one of A, B, and C" can be infringed with only one of the listed items, multiple of the listed items, and one or more of the items in the list and another item not listed.

Other implementations fall within the scope of the following claims.

We claim:

1. A buffer arranged in an integrated circuit, the buffer comprising:
- one or more logic circuits; and
- an input signal pin electrically coupled to an input of one of the one or more logic circuits and an output signal pin electrically coupled to an output of one of the one or more logic circuits;
- wherein the input signal pin and output signal pin are positioned on a same routing track which specifies a routing in the integrated circuit and a respective segment of a net routed to the input and output signal pin is on the same routing track;
- wherein the input signal pin and the output signal pin are constrained to be positioned on the same routing track; and
- wherein the respective segment of the net is constrained to be routed entirely on the same routing track.

2. The buffer of claim 1, wherein the routing track is oriented in a horizontal or vertical direction in the integrated circuit.

3. The buffer of claim 2, wherein the buffer is formed in a first layer of the integrated circuit and signal pins are arranged through one or more layers of the integrated circuit from the first layer to an second layer on which the segments are routed.

4. The buffer of claim 1, wherein a skew of a group of signals which includes a signal output by the output signal pin or input by the input signal pin is less than a threshold amount.

5. The buffer of claim 1, wherein one or more routing tracks in parallel with the same routing track are in between the segments of the buffer and segments of another buffer in the integrated circuit where the segments of the other buffer are routed parallel to the same routing track, the buffer and the other buffer arranged offset from each other along a common side.

6. The buffer of claim 1, wherein the segments routed to the input signal pin and the output signal pin have identical routing topologies.

7. The buffer of claim 1, wherein the segments comprises a lane of a bus of a source synchronous interface.

8. The buffer of claim 1, wherein the buffer spans a distance of two or more routing tracks perpendicular to the same routing track.

9. The buffer of claim 1, wherein a logic circuit of the one or more logic circuits is selected from a group comprising an AND gate, OR gate, and inverter.

10. The buffer of claim 1, wherein a track is in between the segments, the segments being electrically coupled to the buffer and different segments in the integrated circuit electrically coupled to another buffer in the integrated circuit, the different segments along another track parallel to the routing track.

11. The buffer of claim 1, wherein the net of the integrated circuit is defined by a Manhattan routing and the same routing track is in an X or Y direction, where the X and Y direction are perpendicular to each other.

12. The buffer of claim 1, wherein a signal is received by the input signal pin from a first segment of the segments formed on the routing track and is output by the output signal pin to a second segment of the segments formed on the routing track.

13. A method for an electronic design automation (EDA) tool to perform routing in an integrated circuit, the method comprising:
- defining a net in the integrated circuit associated with a skew critical protocol;
- identifying a first segment of a net routed in a first direction along a first track in the first direction on a layer of an integrated circuit;
- positioning a first buffer in the net where the first segment is routed to a first input pin and a first output pin of the first buffer, the first input pin and first output pin positioned on the first track;
- identifying a second segment of the net arranged in a second direction along a second track in the second direction on a layer of an integrated circuit; and
- positioning a second buffer in the net where the second segment is routed a second input pin and a second output pin of the second buffer, the second input pin and second output pin positioned on the second track;
- wherein the first segment is routed perpendicular to the second segment and the first track is perpendicular to the second track;
- wherein the first input pin and first output pin are constrained to be positioned on the first routing track;
- wherein the second input pin and second output pin are constrained to be positioned on the second routing track; and wherein the first segment of the net is constrained to be routed entirely on the first track and the second segment of the net is constrained to be routed entirely on the second track.

14. The method of claim 13, wherein each segment defines a respective lane of a bus coupled to a source synchronous interface.

15. The method of claim 13, wherein a routing of the first segment to the first pins and second pins does not include a detour to a different track.

16. The method of claim 13, wherein a track is in between the segments, the segments being electrically coupled to the buffer and different segments in the integrated circuit electrically coupled to another buffer in the integrated circuit.

17. The method of claim 13, wherein positioning the first buffer comprises positioning the first buffer so that one or more routing tracks in parallel with the first track are in between the first segment and different segments in the integrated circuit, the different segments of another buffer in the integrated circuit where the segments of the other buffer are routed in the first direction, the first buffer and the other buffer arranged offset from each other along a common side.

18. The method of claim 13, wherein the first segment routed to the first input pin has identical routing topologies to the second segment routed to the second input pin and the first segment routed to the first output pin has identical routing topologies to the second segment routed to the second output pin.

19. The method of claim 13, wherein the net of the integrated circuit is defined by a Manhattan routing and the same routing track is in an X or Y direction, where the X and Y direction are perpendicular to each other.

20. The method of claim 13, wherein the first buffer spans a distance of two or more tracks in the second direction.

* * * * *